United States Patent
Mozo

(10) Patent No.: US 7,352,871 B1
(45) Date of Patent: Apr. 1, 2008

(54) APPARATUS FOR COMMUNICATION AND RECONNAISSANCE COUPLED WITH PROTECTION OF THE AUDITORY SYSTEM

(76) Inventor: Ben T. Mozo, 111 Magnolia Cir., Enterprise, AL (US) 36330

( * ) Notice: Subject to any disclaimer, the term of this patent is extended or adjusted under 35 U.S.C. 154(b) by 832 days.

(21) Appl. No.: 10/626,000

(22) Filed: Jul. 24, 2003

(51) Int. Cl.
- A61F 11/06 (2006.01)
- H04R 1/10 (2006.01)
- H04R 25/00 (2006.01)
- H03G 11/00 (2006.01)

(52) U.S. Cl. .......................... 381/72; 381/74; 381/380; 381/71.6; 381/55

(58) Field of Classification Search ................ 381/380, 381/71.6, 72, 74, 55
See application file for complete search history.

(56) References Cited

U.S. PATENT DOCUMENTS

| | | | |
|---|---|---|---|
| 3,952,158 A * | 4/1976 | Kyle et al. ..................... | 381/72 |
| 4,064,362 A * | 12/1977 | Williams ..................... | 381/72 |
| 4,479,239 A * | 10/1984 | Rhines ........................ | 381/72 |
| 4,880,076 A | 11/1989 | Ahlberg et al. | |
| 4,928,311 A * | 5/1990 | Trompler ..................... | 381/72 |
| 4,975,967 A | 12/1990 | Rasmussen | |
| 5,002,151 A | 3/1991 | Oliveira et al. | |
| 5,182,774 A * | 1/1993 | Bourk ........................ | 381/71.6 |
| 5,426,719 A | 6/1995 | Franks et al. | |
| 5,550,923 A | 8/1996 | Hotvet | |
| 5,631,965 A * | 5/1997 | Chang et al. ................. | 381/72 |
| 6,175,633 B1 * | 1/2001 | Morrill et al. ............. | 381/71.6 |
| 6,801,629 B2 * | 10/2004 | Brimhall et al. ............. | 381/72 |
| 7,039,195 B1 * | 5/2006 | Svean et al. ................ | 381/71.6 |

OTHER PUBLICATIONS

Communication & Ear Protection, Inc. Website, Jun. 13, 2003.
Sordin Website, Jun. 10, 2003.
Davies Industrial Communications Ltd., Jun. 9, 2003.
Thales Acoustics Website, Jun. 9, 2003.
Electronics Shooters Protection, Jun. 9, 2003.
Peltor Website, Jun. 9, 2003.
Ceotronics Website, Jun. 9, 2003.
USAARL Report No. 2002-12, Jul. 2002.

* cited by examiner

*Primary Examiner*—Vivian Chin
*Assistant Examiner*—Devona E. Faulk
(74) *Attorney, Agent, or Firm*—Bradley, Arant, Rose & White, LLC

(57) ABSTRACT

A method and apparatus are disclosed for listening to ambient sounds, engage in face-to-face communication, listen to and transmit voice communications, while also protecting the auditory system from hazardous sound pressure levels. Increased gain permits the user to maximize his sound detection ability during "reconnaissance and sentry" activities, thereby increasing the user's ability to detect and localize low level sounds such as, for example, enemy movement or activity. The throughput of the system is linear creating high fidelity of sound until the output level for a particular setting of the final gain reaches the limits established by the power supply. At that point, the output reaches a hard limit. This supply voltage also limits the output to the ear for any instantaneous increase in sound pressure levels. The invention includes barriers to attenuate ambient sounds from entering the ear canal and means for providing sound to the occluded portion of the ear canal. Therefore, hazardous impact noise (e.g., weapons blast, small arms fire, etc.) does not pass through the invention while ambient sounds and conversation are received at a level suitable for the auditory system.

8 Claims, 8 Drawing Sheets

APPARATUS FOR COMMUNICATION AND RECONNAISSANCE COUPLED WITH PROTECTION OF THE AUDITORY SYSTEM

FIELD OF THE INVENTION

The present invention is a novel apparatus for face to face and radio communication, sound detection, localization and recognition, as well as protection from high-level instantaneous impact noise.

BACKGROUND OF THE INVENTION

In environments of excessive sound levels, the human auditory system suffers damage. These environments include, without limitation, combat settings for the military and civilian authorities, aviation, emergency rescue and healthcare, construction, manufacturing, mining, forestry, hunting, entertainment and others. Often the excessive sound levels are intermittent bursts whose exact timing cannot be anticipated. In such settings, attenuating sound levels is not enough because there is an equivalent need for communication and information gathering through the auditory system on account of the needs of safety and job performance. Communications, information gathering and safety would be much improved if attenuation were coupled with effective means to block out sounds temporarily when ambient levels are dangerous to the auditory system. Likewise, these ends would be served best if the sounds allowed through to the auditory system were of the highest fidelity possible. There is also a need for an effective apparatus and method for reconnaissance providing heightened sensitivity to low level ambient sounds.

The present invention should be used in any environment where electrically augmented communication or auditory detection is required. For example, soldiers in combat must use all of their senses to survive and perform on the modern battlefield. Their hearing must be protected from damage from hazardous impact and sustained noise, (i.e. small arms firing, artillery, aircraft and armor noise), without compromising their ability to hear and communicate in these environments. Hearing is often essential to detect, locate and recognize the enemy. As well, soldiers must understand ambient sounds within their immediate environment and communicate between themselves both on a face-to-face basis, and via radio in secure modes during mission operations. Operational contingencies, missions and environments, such as night reconnaissance and operations, Chemical, Biological and Nuclear (CBN) defense modes, or smoke, dust and haze during movement on the battlefield confound the soldier's ability to perform these tasks. Communication would be undiminished in personnel wearing full body protective clothing (e.g. Chemical Protective Ensembles, Whole-body Thermal Protective Suits) when the invention is integrated into the ensemble. Emergency and rescue personnel, firefighters, law enforcement, interdiction, counter-terror and SWAT teams, recreational shooters, hunters as well as heavy industry and construction workers would all benefit from the face to face and electronic communication augmentation attributes of this invention, as well as the high level of hearing protection it provides.

There have been efforts to attenuate excessive sounds with barrier devices, and there have been efforts to filter out or block excessive sound levels with electronic systems. There remains a need, however, for devices and methods which allow sufficient fidelity for the ambient and necessary sounds of speech and the local environment, and which also provide superior protection by attenuating ambient sounds and then allowing only those sounds through the electronic system which do not exceed levels unsafe to the auditory system.

SUMMARY OF THE INVENTION

The present invention satisfies these needs first by attenuating, by means of a barrier for each ear, all ambient sounds. These attenuation barriers may take any of a number of forms including, without limitation, expanding foam ear plugs with a channel allowing passage of sounds suitable for the auditory system provided by the electronic circuits described herein. The sounds transduced by the invention are suitable for the auditory system because the invention's sound output is interrupted during high levels of ambient sound which might damage the auditory system. Thus, ambient sounds not transduced by the electronic circuit are attenuated, while ambient sounds which are transduced by the electronic circuit are supplied to the ear.

The invention provides two electronic circuits (one for each ear) which protect the auditory system from high sound levels. Each circuit transduces ambient sounds by means of a microphone positioned on each side of the head near the outermost portion of the external auditory canal of the ear. The electronic circuit then amplifies the electronic signal at a fixed rate of gain. When ambient sounds reach a dangerously high level which could damage the auditory system, the electronic circuit's electronic signals rise to such a level which causes the voltage in the system to reach a hard limit. The electronic circuit then saturates and stops transmitting sound to the wearer within 10 microseconds of the onset of the excessively high sound level. Within 30 microseconds after the excessive sound level abates, the electronic circuit is no longer saturated, and the electronic circuit resumes transmitting transduced sounds to the wearer. High fidelity of sounds furnished by the electronic circuits is assured by the fixed gain amplification. The high fidelity of sound produced by the invention minimizes the effect of interruption as a result of the invention's de-activation of sound production, and thus maximizes the wearer's ability to discern the meaning of speech and other sounds despite interruptions as a result of de-activation of sound from the electronic circuits.

One example of a particularly useful military application for the invention is for combatants who dismount from airplanes, helicopters, armor or other vehicles. The invention allows the user to listen to surrounding ambient sounds, accomplish face to face communication, listen and respond to radio messages and to protect himself from hazardous sound pressure levels. Reception and amplification of ambient sounds are controlled by the user through activation of a pair of gain-control switches that either increase or decrease the electronic output gain. Increasing the gain permits the user to maximize his sound detection ability during "reconnaissance or sentry" activities with low levels of sound, thereby increasing the probability of detecting and localizing movement of others or other activity.

The throughput of the invention is linear until the output level for a particular setting of the final gain reaches the limits established by the power supply. At that point, the output reaches a hard limit. This supply voltage limits the sound output to the ear for any increase in sound pressure levels that might be dangerous to the auditory system.

Throughout the electronic processing in all configurations, the linearity of the signals is preserved. The linearity of the invention enhances the fidelity of sounds that are detected by the microphone. The fidelity of the invention improves the user's ability to discriminate and determine the cause of the sound, i.e., twig snap, rifle bolt closure, talking, vehicle movement, and define its position in the environment.

The invention can be mounted on a helmet, a headband, or any other head-mounted apparatus. The headband configuration utilizes the hearing enhancement module ("HEM") and accommodates reconnaissance or sentry activities. The only difference in the helmet or headband configurations is the placement of the microphone: on the side of the helmet or, in the headband configuration, embedded in the communications ear plug. A communications ear plug is a device which plugs into a radio communications system and has an earphone. The communications ear plug is a pre-existing device and is not part of the invention except in one respect: in the headband configuration, a microphone is added to and embedded in the communications ear plug. In any configuration, placement of the microphones should be as near as possible to the ear canal, so as to minimize the auditory system's adaptation from a normal head-related transfer function.

BRIEF DESCRIPTION OF THE DRAWINGS

These and other features, aspects, structures, advantages, and functions are shown or are inherent in, and will become better understood with regard to, the following description and accompanied drawings where.

DETAILED DESCRIPTION OF THE PREFERRED EMBODIMENT

In the electronic circuit in the helmet configuration (FIG. 4), ambient sounds are received via each of two microphones 1 mounted on the helmet to the left and right and forward of each ear. As used throughout this application, a "microphone" is a device that transforms sound pressure waves that impinge on a sensing element into essentially equivalent voltage signals that are supplied to the electronic circuits. In the electronic circuits depicted, in FIG. 4 and FIG. 5, the microphones have a bandwidth of 40 to 8,000 hertz. The arrangement of the invention requires that the sensitivity of the microphone be calibrated in order to establish a dB cutoff for the power supply. Other factors in adjusting the components of the invention are the frequency of the sound reaching the microphone and the microphone's sensitivity as a function of frequency. The specification for the particular microphone depicted includes a range of 6 dB, (−54.0 to −60.0 dB re 1 v/ubar) for 1000 Hertz. Other combinations of microphones with different sensitivities and amplifier sets can be used.

Figure 1:
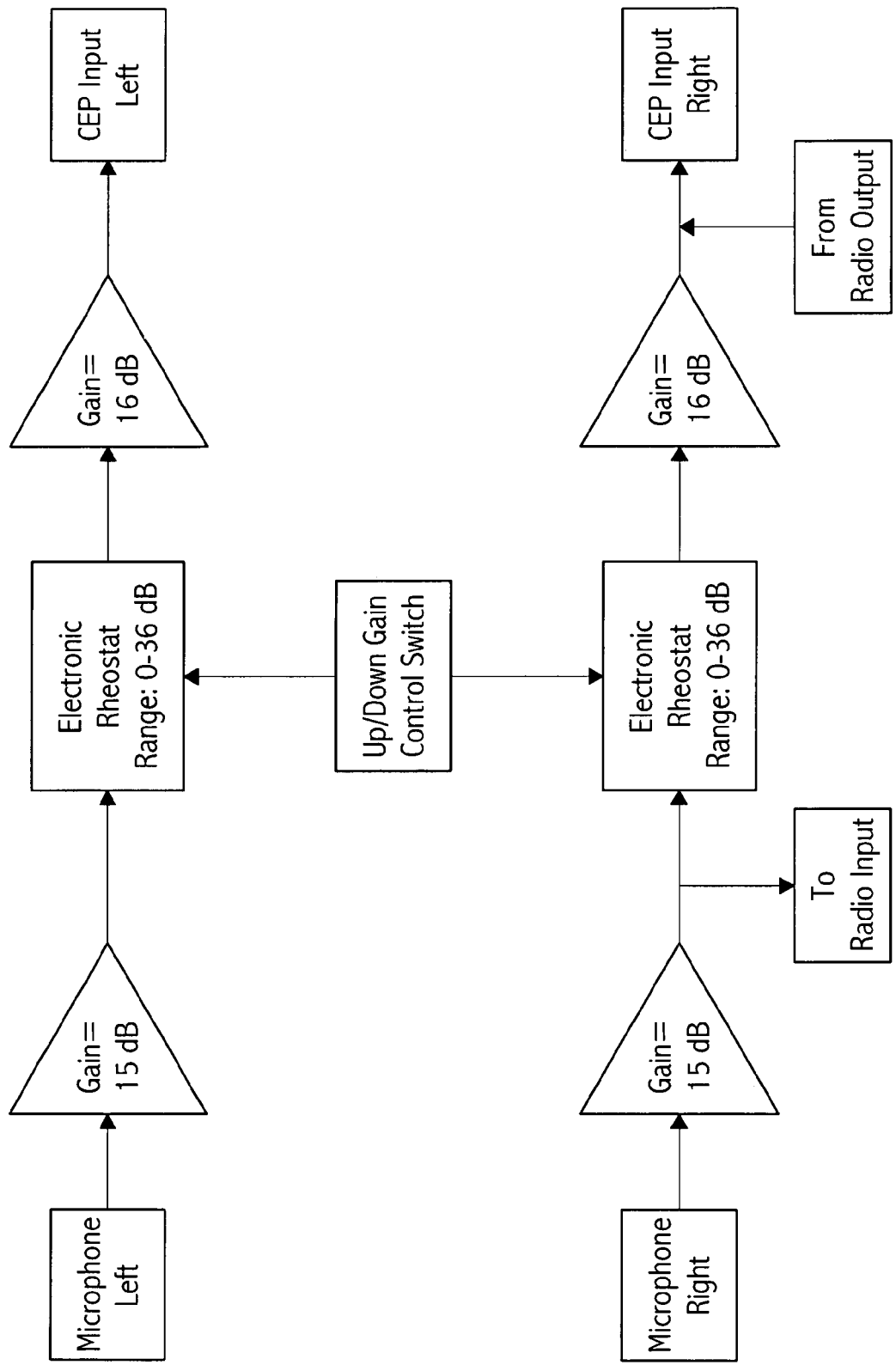
FIG. 1 is a block diagram showing the flow of electronic signals in the invention.
Figure 2:
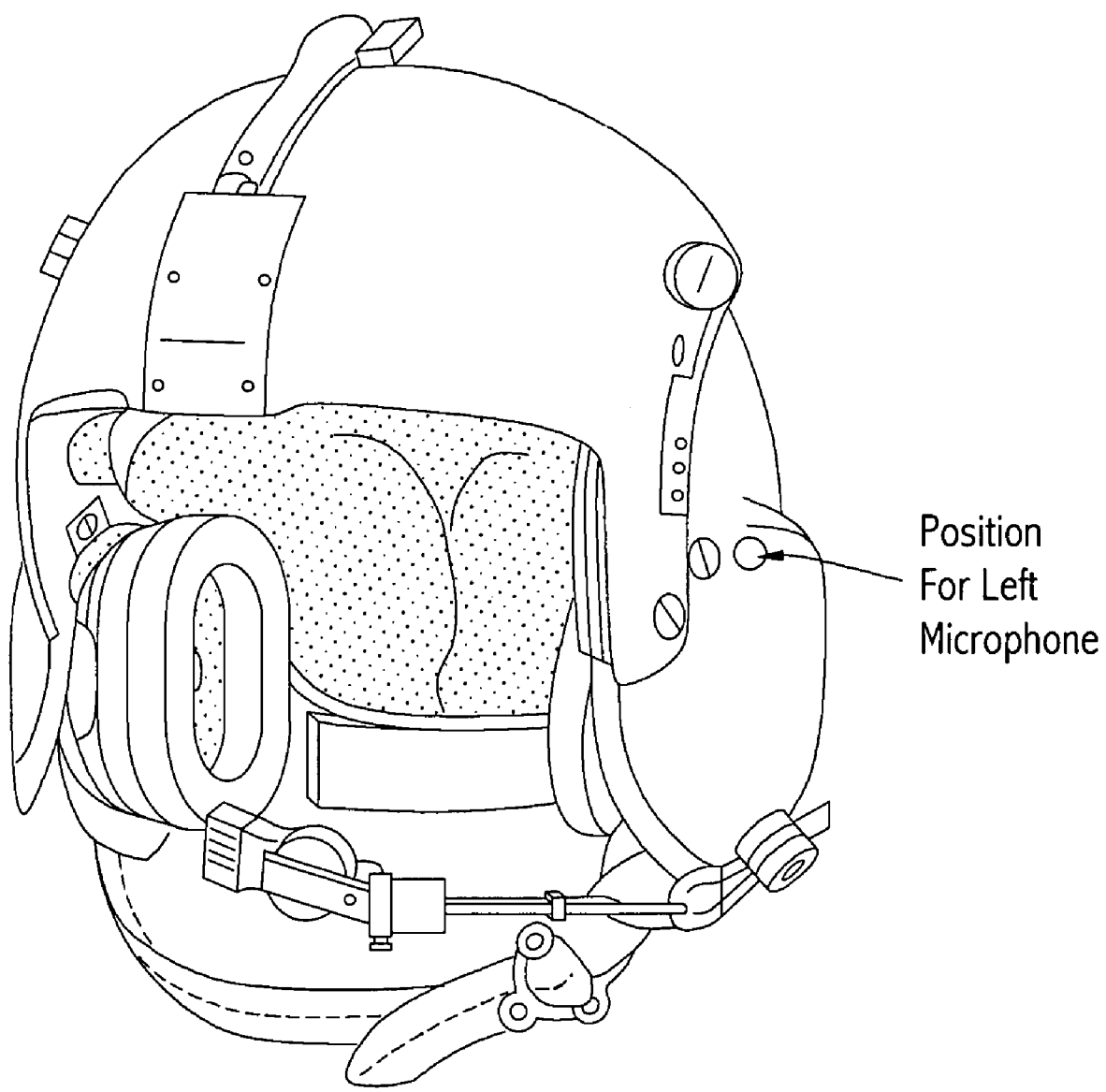
FIG. 2 is a combat aviation helmet showing the position of the invention's left microphone in the helmet configuration.
Figure 3:
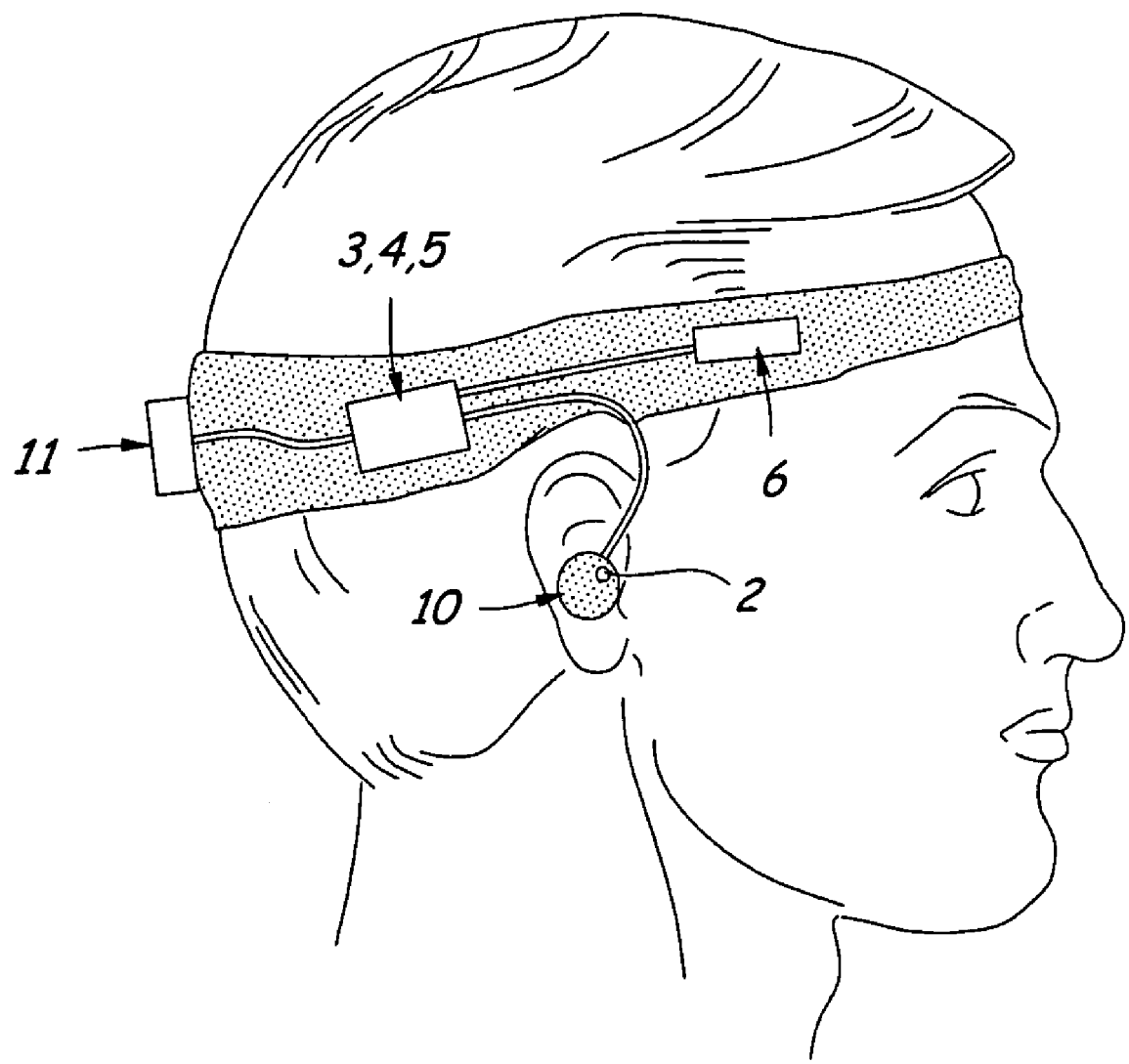
FIG. 3 shows the invention being worn in the headband configuration.
Figure 4:
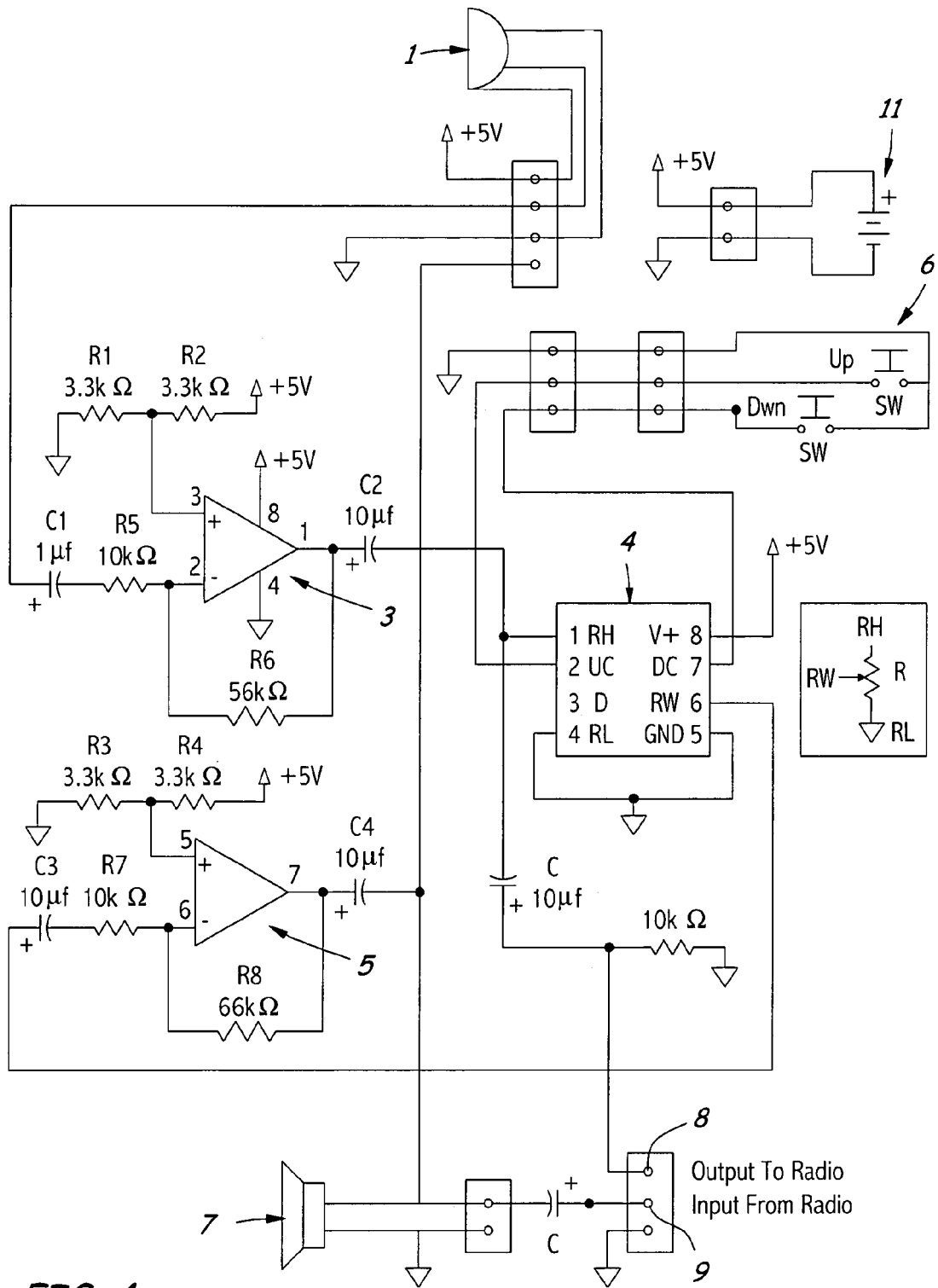
FIG. 4 is a diagram of the electronic circuit for one ear in the helmet configuration.
Figure 5:
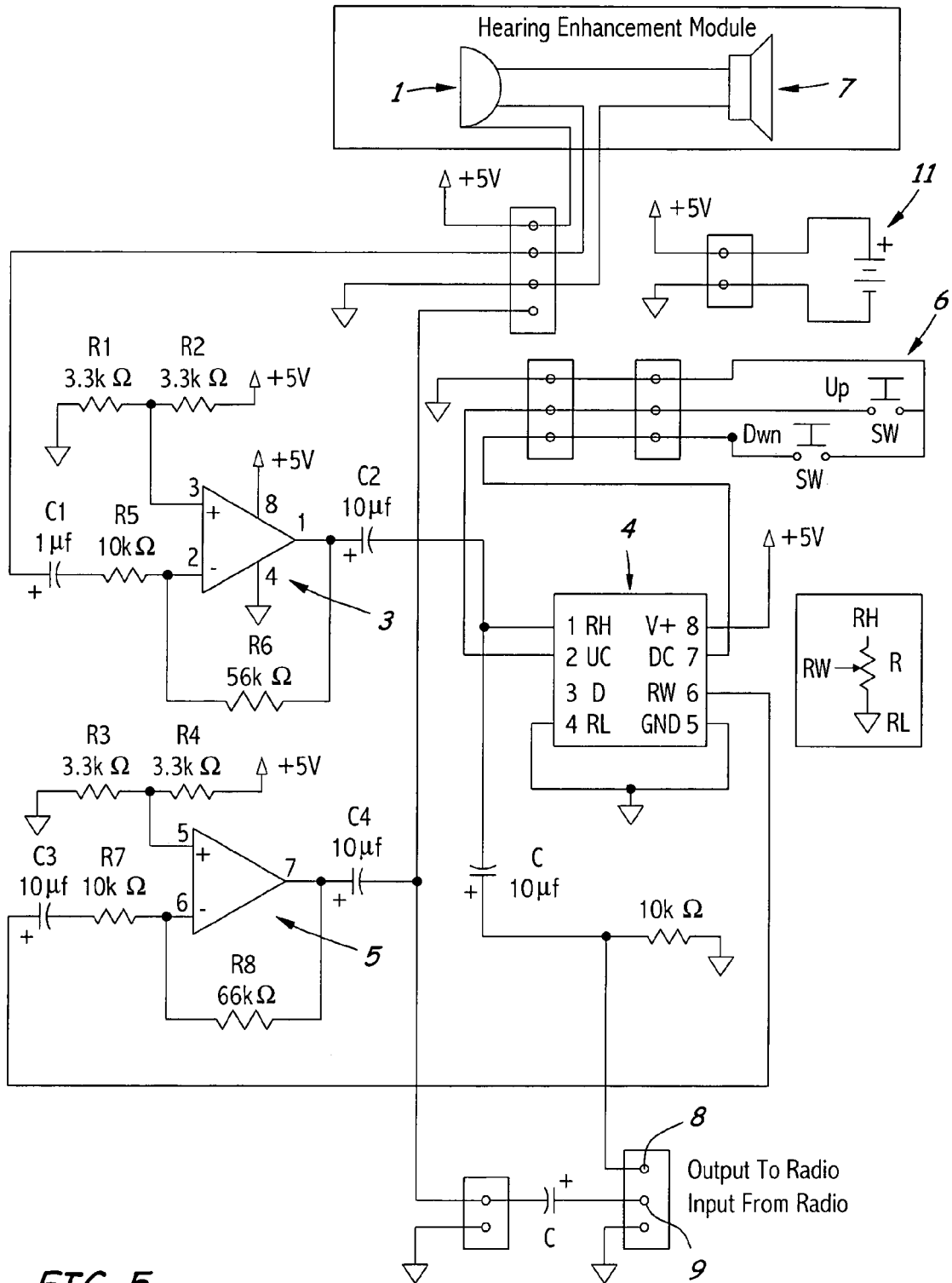
FIG. 5 is a diagram of the electronic circuit for one ear in the headband configuration.
Figure 6B:
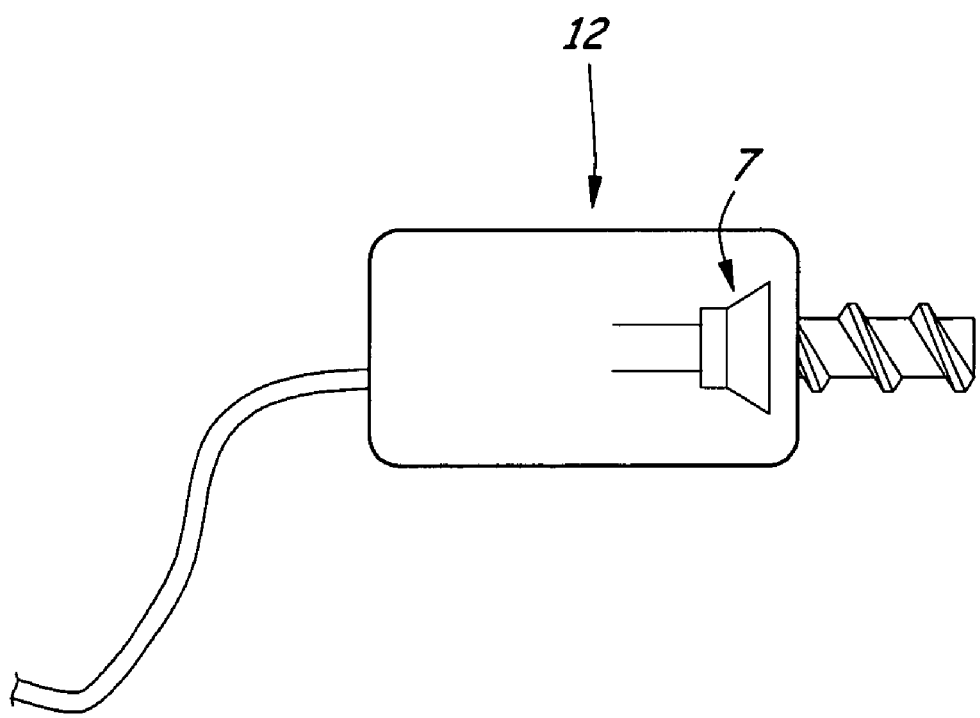
FIG. 6B shows a simplified version of the contents of the communications ear plug in its configuration pre-existing this invention.
Figure 7A:
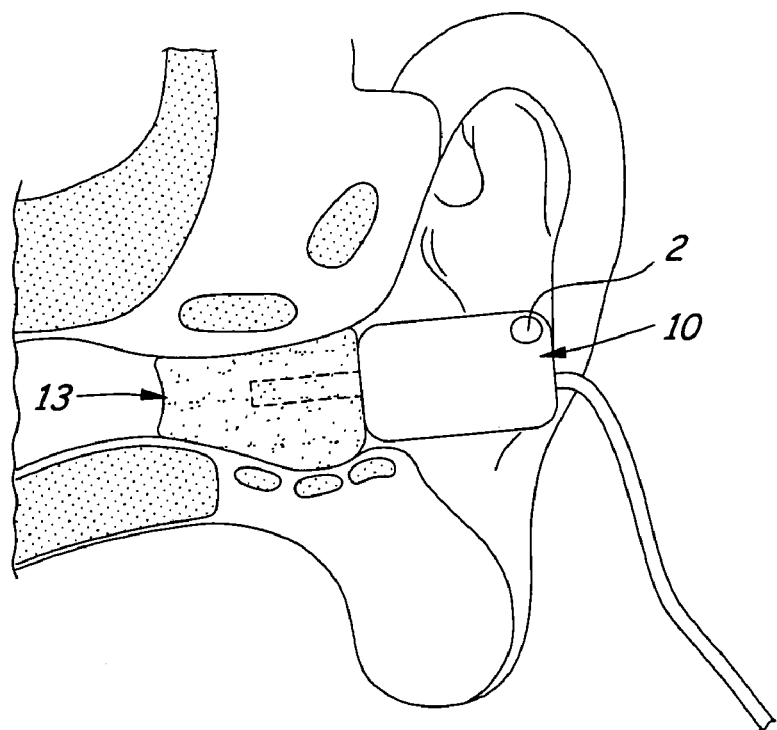
FIG. 7A is a cutaway drawing of the ear pinna and external auditory canal with the expanding foam ear plug and communications ear plug worn in the invention's headband configuration.
Figure 7B:
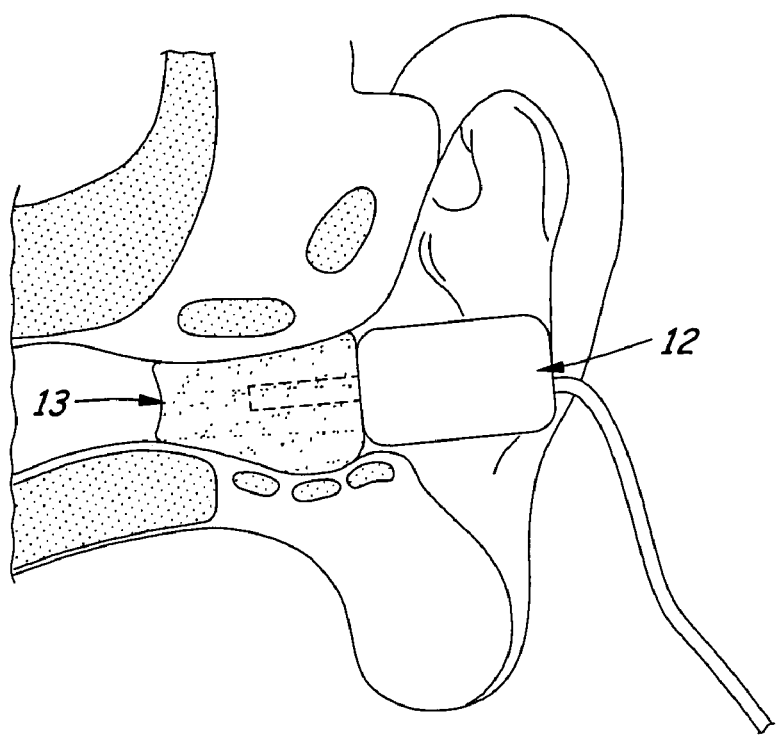
FIG. 7B is a cutaway drawing of the ear pinna and ear canal with the pre-existing communications ear plug. The only difference between FIGS. 7A and 7B is the depiction of the location of the microphone input port.
Figure 8:
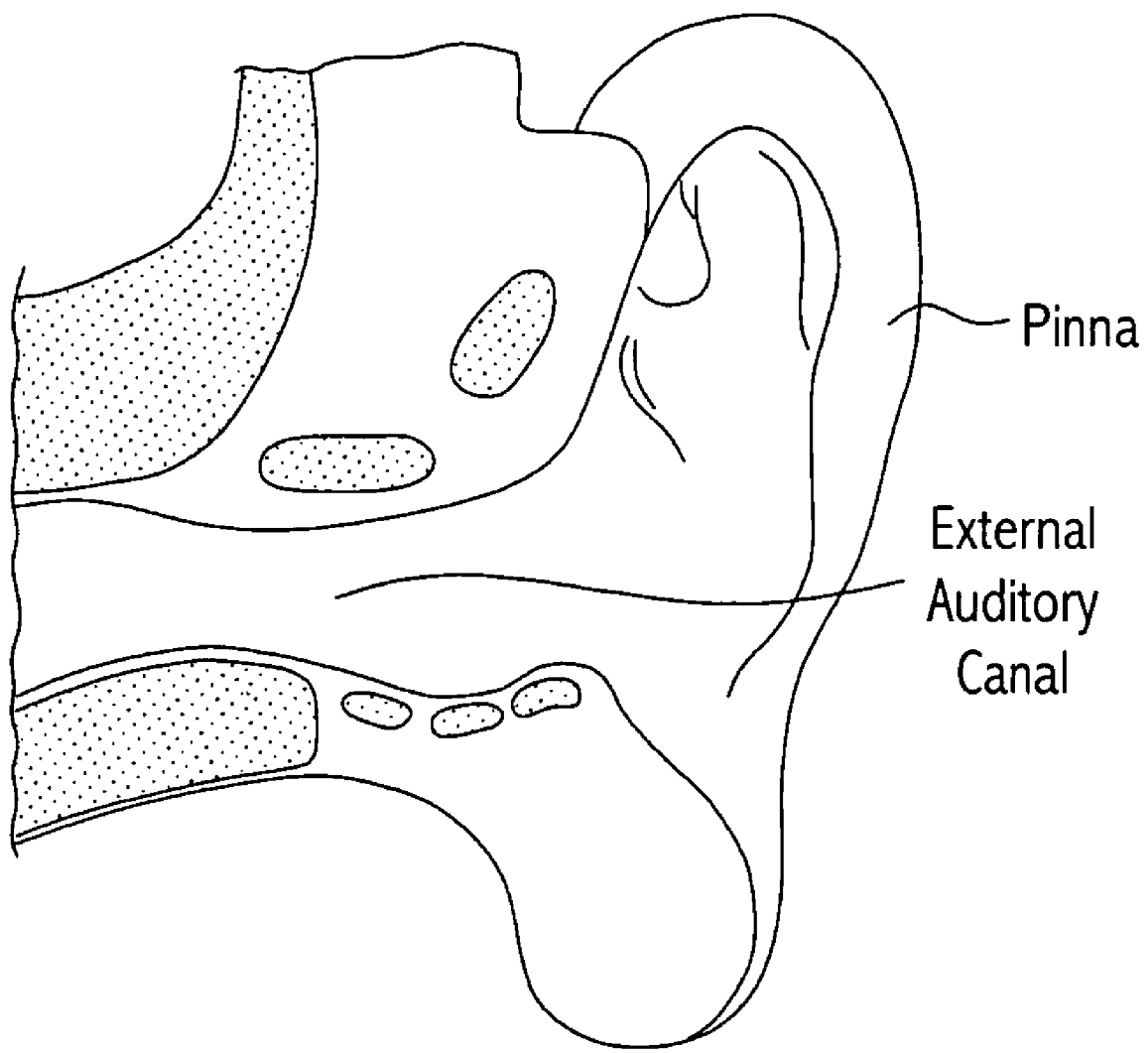
FIG. 8 is a cutaway drawing of the ear pinna and external auditory canal.

The circuit design for the invention is shown in FIGS. 4 and 5, with the only difference between these two figures being the placement of the microphone 1—in the helmet configuration (FIG. 4) the microphone is inset in the helmet (FIG. 2), and in the headband configuration (FIG. 5) the microphone is built into the communications ear plug. The communications ear plug 12 is a pre-existing device which is not part of the invention, and it is shown in its unimproved form on FIGS. 6B and 7B. The communications ear plug 12 has a threaded protrusion which screws into the expanding foam ear plug 13 on FIG. 7A. The communications ear plug 12 is manufactured by Communications & Ear Protection Systems, Inc. of Enterprise, Ala. An aspect of the present invention is the addition to the communications ear plug of the microphone 1 which is accessed by the microphone input port 2, as depicted in FIG. 3, 6A, 7A.

The microphone receives and transduces ambient sounds into electrical signals and applies them to the input stage of the fixed-gain pre-amplifier 3 as depicted in FIG. 4 and FIG. 5. As used herein, "fixed-gain pre-amplifier" means a pre-amplifier configured for constant gain of voltage signals that are output to the rest of the electronic circuit. The amount of fixed-gain for the pre-amplifier 3 may vary, but in the embodiments depicted in FIG. 4 and FIG. 5 the output is 5.6 times the input from the microphone. The particular fixed-gain pre-amplifier employed in these embodiments will reach the rail at about 128 dB for the least sensitive microphone (−60 dB) while a more sensitive microphone will reach the rail at about 122 dB. If the gain of the preamplifier is changed from 5.6, then a different cutoff value in dB will be established. A representative dual amplifier system which can be incorporated into the invention is Analog Device's model #SSM2135.

The output of the fixed-gain pre-amplifier goes to the rheostat 4. In the embodiments depicted herein, the rheostat is digital and a representative one is manufactured by Dallas Semiconductor of Sunnyvale, Calif. Variable gain of the input signals that are present in the circuits for each ear are controlled by the user. Signal gain is adjusted, using a pair of momentary contact switches, herein called "gain-control switches," 6 which emulate movement of a volume control by either increasing or decreasing the signal that is available at the output (RW) of both the left and right side digital rheostats, (FIG. 4 and FIG. 5). Specifically, the up and down gain-control switches 6 control the pick-off voltage point that is between the fixed-gain pre-amplifier output and ground. A single press of the up or down gain-control switch 6 will move the pick-off voltage point $1/64^{th}$ of the total range in the direction of the switch that is pressed. The adjustment speed of the rheostat 4 allows for a full range of travel, from lowest point to highest point, in approximately 7 seconds when the one of the gain-control switches 6 is pressed continuously. Each rheostat 4 covers a resistive range of 10 k Ohms where the lowest setting on the rheostat reduces the throughput signal to zero while the highest setting allows the full signal to be throughput. Adjusting the settings of both circuits to either the upper or lower limit synchronizes the left and right side rheostats 4.

The signal present at the output of each rheostat 4 is supplied to and amplified by the fixed-gain output amplifier 5, which in the embodiments depicted has a gain multiplier of 6.8 times. As used herein, "fixed-gain output amplifier" means an output amplifier configured for constant gain of voltage signals that are input, and which is capable of providing power necessary to drive the earphone 7 in a distortion free manner. The output of the fixed-gain output amplifier 5 in each circuit is provided to the earphone 7, which is located either in the helmet communications ear plug or in the Hearing Enhancement Module (HEM) 10 used in the headband version. As used herein, "earphone" means a device that transduces voltage signals into essentially equivalent pressure signals.

Increasing the gain permits the user to maximize his sound detection ability during "reconnaissance and sentry" activities, thereby increasing the probability of detecting and localize sounds. The throughput of the invention is linear until 10 microseconds or less after the output level reaches the output limits established by the power supply. At that point, the output reaches a hard limit. In either the helmet or headband configurations, the supply voltage thus limits the output to the ear for any instantaneous increase in sound pressure levels but permits recovery of the listening capability in less than 30 microseconds after the sound pressure level recedes.

The invention also can be connected to a radio communications system so that the user can simultaneously receive radio communications. The output from 8 and input to 9 the radio communications system are shown on FIG. 4 and FIG. 5.

The battery pack for the invention 11 is shown on FIGS. 3, 4, and 5.

Figure 6A:
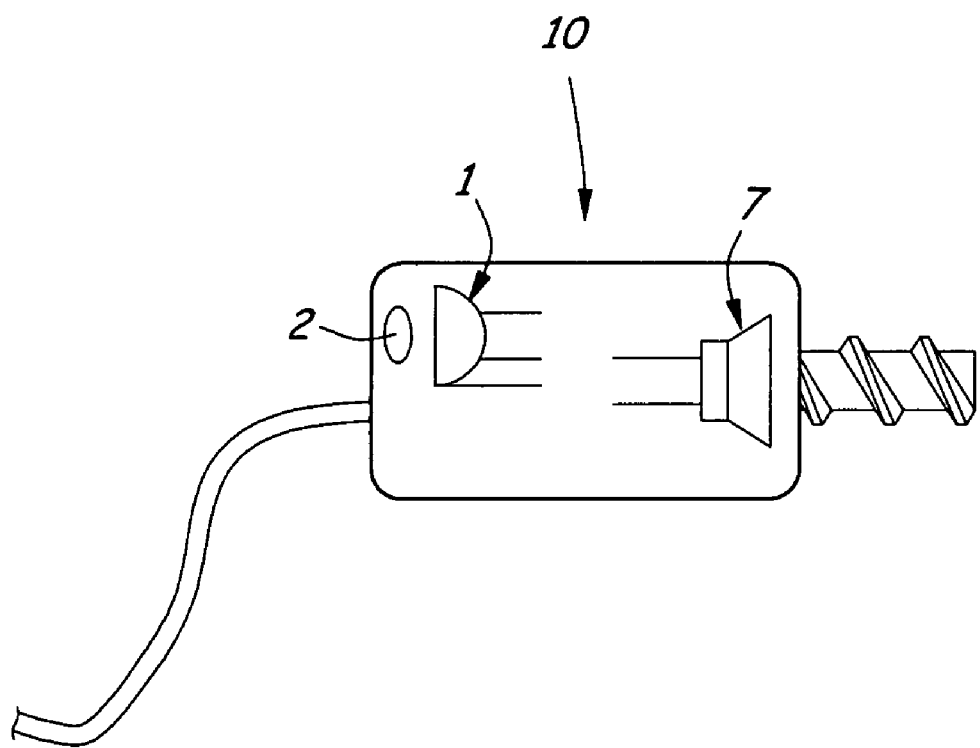
FIG. 6A shows a simplified version of the contents of the communications ear plug in the headband configuration.

In the headband configuration (FIG. 5) the user receives these sounds via the HEM interfaced with a COMPLY™ Soft Tip earplug. Embedded within the HEM, the communications ear plug is combined with a microphone in a single package that allows the ambient sound signals to be sensed at a location near the ear (FIG. 6, FIG. 7). Positioning the microphone near the ear external auditory canal opening allows for much of the normal human capability to localize sound sources to be maintained. Throughout life, individuals develop, through experience and synaptic plasticity of the auditory system (including the brain), the means of interpreting ambient sound waves so that they are able to identify and localize a sound source. One aspect of this sound localization is the inter-aural separation of ambient sounds. Placement of the microphones near the ears on this invention preserves the inter-aural separation and reduces re-training of the human auditory system's ability to localize sound.

As in the helmet configuration, ambient sound waves are detected by the microphone and directed to the amplifier board as voltage signals. The electrical signals are processed and amplified to a level as defined by the user. The resulting signals are then directed to the HEM output portion where electrical signals are transduced into sound signals that are input to the occluded ear canal.

The HEM microphone signal after the first stage of amplification (by the fixed-gain pre-amplifier) is available in the invention for transfer to a radio communications link. This will enable the user to engage in two-way conversation without adding a separate microphone to the ensemble. The voice coupling to the microphone in the HEM is adequate for radio input and can be enhanced for stealth situations by simply cupping the hand over the microphone and directing the voice toward the ear.

What is claimed is:

1. An apparatus for communication and reconnaissance coupled with protection for the auditory system, comprising:
   a sound attenuation barrier for each ear;
   an electronic circuit for each ear, comprising:
      a microphone for transducing ambient sounds into electronic signals, and having an output;
      a fixed-gain pre-amplifier, having an input connected to the output of said microphone, having an output;
      a rheostat having an input connected to the output of said fixed-gain pre-amplifier and having an output;
      a fixed-gain output amplifier, having an input connection to the output of said rheostat, and having an output;
      an earphone, having an input connection to the output of said fixed-gain output amplifier;
      a set of gain control switches coupled to said rheostat for each ear, for increasing or decreasing the level of said electronic signals supplied thereto;
      a power supply that establishes a hard output limit for the electronic circuit when said electronic signal levels exceed seventy-five percent (75%) of the power supply voltage;
      an output to a radio communications system; and
      an input from said radio communications system;
   such that ambient sound waves are attenuated and sound waves suitable for the auditory system are transmitted to the external auditory canal of the ear unless the sound output of the electronic circuit has been de-activated.

2. The apparatus as in claim 1, in which the microphone is built into a communications ear plug.

3. An apparatus for communication and reconnaissance coupled with protection for the auditory system, comprising the acts of:
   a sound attenuation barrier for each ear;
   an electronic circuit for each ear, comprising:
      at least one microphone for transducing ambient sounds into electronic signals, having an output;
      a fixed-gain pre-amplifier, having an input connected to the output of said microphone, and having an output;
      a rheostat having an input connected to the output of said fixed-gain pre-amplifier and having an output;
      a fixed-gain output amplifier, having an input connection to the output of said rheostat, and having an output;
      an earphone, having an input connection to the output of said fixed-gain output amplifier;
      a set of gain control switches coupled to said rheostat for each ear, for increasing or decreasing the level of said electronic signals supplied thereto; and
      a power supply that establishes a hard output limit for the electronic circuit when said electronic signal levels exceed seventy-five percent (75%) of the power supply voltage;
   such that ambient sound waves are attenuated and sound waves suitable for the auditory system are transmitted to the external auditory canal of the ear unless the sound output of the electronic circuit has been de-activated.

4. The apparatus as in claim 3, in which the microphone is built into a communications ear plug.

5. An apparatus for communication and reconnaissance coupled with protection for the auditory system, comprising:
   a sound attenuation barrier for each ear;
   an electronic circuit for each ear, comprising:

a microphone for transducing ambient sounds into electronic signals, having an output;

a fixed-gain pre-amplifier, having an input connected to the output of said microphone, and having an output;

a rheostat having an input connected to the output of said fixed-gain pre-amplifier and having an output;

a fixed-gain output amplifier, having an input connection to the output of said rheostat, and having an output;

a set of gain control switches coupled to said rheostat for each ear, for increasing or decreasing the level of said electronic signals supplied thereto;

a power supply that establishes a hard output limit for the electronic circuit when said electronic signal levels exceed seventy-five percent (75%) of the power supply voltage;

an output to a radio communications system; and an input from said radio communications system;

such that ambient sound waves are attenuated and sound waves suitable for the auditory system are transmitted to the external auditory canal of the ear unless the sound output of the electronic circuit has been de-activated.

6. The apparatus as in claim 5, in which the microphone is built into a communications ear plug.

7. An apparatus for communication and reconnaissance coupled with protection for the auditory system, comprising:

a sound attenuation barrier for each ear;

an electronic circuit for each ear, comprising:

at least one microphone for transducing ambient sounds into electronic signals, having an output;

a fixed-gain pre-amplifier, having an input connected to the output of said microphone, and having an output;

a rheostat having an input connected to the output of said fixed-gain pre-amplifier and having an output;

a fixed-gain output amplifier, having an input connection to the output of said rheostat, and having an output;

a set of gain control switches coupled to said rheostat for each ear, for increasing or decreasing the level of said electronic signals supplied thereto; and a power supply that establishes a hard output limit for the electronic circuit when said electronic signal levels exceed seventy-five percent (75%) of the power supply voltage;

such that ambient sound waves are attenuated and sound waves suitable for the auditory system are transmitted to the external auditory canal of the ear unless the sound output of the electronic circuit has been de-activated.

8. The apparatus as in claim 7, in which the microphone is built into a communications ear plug.

\* \* \* \* \*